March 8, 1966 R. H. ALLMARK 3,239,686

TRANSISTOR SWITCH WITH SATURATION CONTROL MEANS

Filed Oct. 5, 1962

Inventor:
Reginald Hugh Allmark
By: Stevens, Davis, Miller & Mosher
Attorneys

United States Patent Office 3,239,686
Patented Mar. 8, 1966

3,239,686
TRANSISTOR SWITCH WITH SATURATION CONTROL MEANS

Reginald Hugh Allmark, Stoke-on-Trent, England, assignor to The English Electric Company Limited, London, England, a British company Filed Oct. 5, 1962, Ser. No. 228,690
Claims priority, application Great Britain, Oct. 11, 1961, 36,478/61
3 Claims. (Cl. 307—88.5)

This invention relates to an electric transistor switching means, and to the use of such switching means in electric digital computing apparatus.

According to the present invention an electric transistor switching means includes a main transistor having its emitter-collector circuit connected in a switching circuit which extends between two terminals, an auxiliary transistor connected in series with emitter and collector loads in an auxiliary circuit which is connectible between two different potential tappings of an electric supply source, the collectors of the two transistors being electrically connected together, and the base of the main transistor being electrically connected with the emitter of the auxiliary transistor, and base control means responsive to a two-state input signal for setting the base potential of the auxiliary transistor relative to the potentials of the supply source tappings at one or the other of two control potentials which cause the auxiliary transistor to be fully conductive or non-conductive respectively in dependence upon the state of the input signal, and means for connecting the emitter of the main transistor to a tapping of the supply source which has a potential intermediate those of the aforesaid tappings of the supply source, the emitter and the collector loads of the auxiliary transistor being so proportioned that when the auxiliary transistor is held in the conductive condition the collector-base junction of the auxiliary transistor is forward biased, the auxiliary transistor is saturated, and the main transistor is almost but not quite saturated.

The base control means for the auxiliary transistor may comprise a potential divider connected in parallel with the said auxiliary circuit and having a first tapping connected to the base of the auxiliary transistor so that the base is normally held at a base potential such as to render the auxiliary transistor fully conductive, and an input connection connected to a second tapping on the divider and including a diode for enabling current flow into the divider so as to adjust the base potential of the auxiliary transistor to the non-conductive value whenever the input voltage signal applied to the input connection is of the state for rendering the auxiliary transistor non-conductive, the diode becoming reverse-biased whenever the input signal applied to the input conneciton is of the other state.

One electric transistor switching means according to the invention will now be described by way of example with reference to the accompanying drawings, which show in FIG. 1 a diagram of the circuit arrangement of the switching means, and in FIG. 2 a diagram of one example of a load circuit to be controlled by the circuit arrangement of FIG. 1, this load circuit being part of an electric digital computing apparatus.

Figure 1:
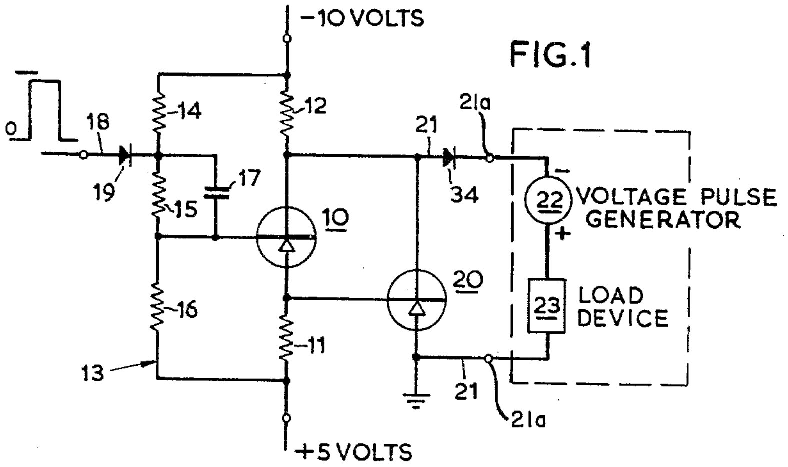

Referring now to FIG. 1 a first or auxiliary transistor 10 having emitter and collector load resistors 11, 12 is connected as shown between +5 and −10 volt tappings of a D.C. supply source. A base control means for the transistor includes a potential dividing circuit 13 connected between the same potential tappings of the supply source and comprising a chain of resistors 14, 15 and 16. The resistor 15 is shunted by a capacitor 17, and an input circuit 18 for receiving a two-state input voltage signal is connected to the junction of the resistors 14 and 15 through a diode 19. The base of the transistor 10 is connected to the junction of the resistors 15 and 16.

The input circuit 18 is connectible with a control circuit (not shown) which operates to maintain the input circuit alternatively at a potential equal to that of the zero poential tapping of the D.C. supply source, or at a suitably high negative potential such as to render the transistor 10 fully conductive.

A second or main transistor 20 has its emitter connected to the zero potential tapping of the supply source, its collector connected to the collector of the transistor 10, and its base connected to the emitter of the transistor 10.

Output circuit connections 21 incorporating a diode 34 connect the emitter and collector of the transistor 20 to input-output terminals 21*a*, and to these terminals is connected a load circuit which includes a voltage pulse generator 22 and a load device 23.

The circuit arrangement comprising items 10 to 21 when in operation acts as a variable impedance or switching device exercising control over current pulses which are initiated by the voltage pulse generator 22. This circuit arrangement is rendered ineffective to pass a load circuit current when the input circuit 18 is maintained at the said zero potential, the transistors 10 and 20 then being effectively non-conductive, and effective to pass load circuit current when the input circuit 18 is maintained at the said high negative potential.

The various circuit parameters have values such that the following mode of operation is achieved.

When the input circuit 18 is maintained at zero potential the base of the auxiliary transistor 10 is positive with respect to the zero potential tapping of the supply source, and transistor 10 carries a small base current which is just sufficient to support an emitter current as largely defined by the positive supply potential and the resistance of resistor 11. In this condition the collector current is very small, and the emitter of transistor 10 is maintained at a potential slightly more positive than that of the base of transistor 10, so that the base circuit of the main transistor 20 is maintained at a potential which is positive relative to that of the emitter of the transistor 20. The latter is thus rendered non-conducting. The emitter and collector load resistors 11 and 12 are so proportioned that under this condition the collectors of the transistors are maintained at a potential very close to that of the −10 volt tapping of the D.C. supply source.

Thus in the event of the generator 22 inducing a voltage pulse into the load circuit no appreciable current can flow in the output connections 21 and load device 23.

However, when the input circuit 18 is maintained at the said high negative potential a substantial base current flows in the auxiliary transistor 10 with a consequent flow of current from the emitter to the collector of this transistor 10. As a result of the flow of this current through the emitter load resistor 11 the potential of the base of the main transistor 20 becomes negative with respect to that of the emitter of transistor 20 so that the latter carries an appreciable base current thus enabling the flow of collector current in the transistor 20.

The consequent increase in the current flowing in the collector load resistor 12 progressively raises the potential of the collectors of the two transistors, and hence automatically acts to regulate the flow of collector current in the auxiliary transistor 10.

As the collector current of the main transistor 20 continues to increase, the potential of the collector of the auxiliary transistor 10 eventually becomes positive with respect to the base of transistor 10, thus forward-biasing the collector-base diode of transistor 10 and causing an additional base current to flow from the collector circuit of transistor 10. As the total base current of transistor 10 is fairly closely defined by the supply potentials and the resistance values of the resistors 14, 15 and 16 the flow of this additional base current from the collector circuit results in a corresponding decrease in the flow of base current from the emitter circuit 11, a rise in the base potential of transistor 20, and a consequent regulating action for the transistor 20. The collector current of transistor 20 eventually settles at an equilibrium value when the flow of emitter-base current in transistor 10, falling in response to the changed current flow condition in the transistor, causes the base potential of the transistor 20 to control in a stablising manner the flow of emitter-collector current in the transistor 20 at an appropriate value.

In this equilibrium condition the auxiliary transistor 10 is in a saturated condition, there being only a small effective or resultant potential difference between the emitter and collector; the saturation base current of transistor 10 is largely provided by the collector circuit, the emitter-base current being reduced to a suitably low value; and the main transistor 20 operates in a condition just short of saturation, carrying base and collector currents such as are necessary to maintain this equilibrium condition.

It will be appreciated that no current can flow in the load device 23 under this condition due to the presence of the diode 34 and the lack of an output voltage of the generator 22. However, if the voltage pulse generator 22 induces a voltage pulse in the load circuit, of the polarity indicated, a current pulse builds up rapidly, initially by the flow of current through the emitter-base circuit of the main transistor 20 and the emitter-collector circuit of the saturated auxiliary transistor 10. The latter behaves temporarily as a short circuit between the base and collector of the transistor 20 during this initial period of the current pulse, meeting the instantaneous demand for current by virtue of its saturated condition, and within a limit determined by its saturation current gain. The flow of base current in the transistor 20 causes the emitter-collector path of the latter to conduct current due to the voltage pulse of the generator, and thereby substantially increase the magnitude of the current pulse, by virtue of the now greatly reduced impedance of the base-collector path. Simultaneously a resulting temporary depression of the potential of the collector of transistor 10 causes the collector current of this transistor to reverse its direction of flow, thus causing the transistor 10 to revert to its normal amplifier mode of operation, and thereby present a lower impedance to the flow of base current of transistor 20 so that this base current thereupon increases to a value just sufficient to prevent the latter transistor saturating.

At the end of the voltage pulse the circuit arrangement returns to its aforesaid condition of equilibrium such as existed before the production of the voltage pulse.

The three separate effects just described all contribute to the production of a very high rate of build-up of a current pulse each time the generator produces a voltage pulse, these three effects being (a) the provision of the aforesaid very low impedance path for the initial flow of pulse current through the saturated auxiliary transistor 10, (b) the rendering of the main transistor 20 more conductive by the initial flow of pulse current, and (c) the restoration of the auxiliary transistor 10 to its normal amplifying mode of operation to control the main transistor 20.

Figure 2:
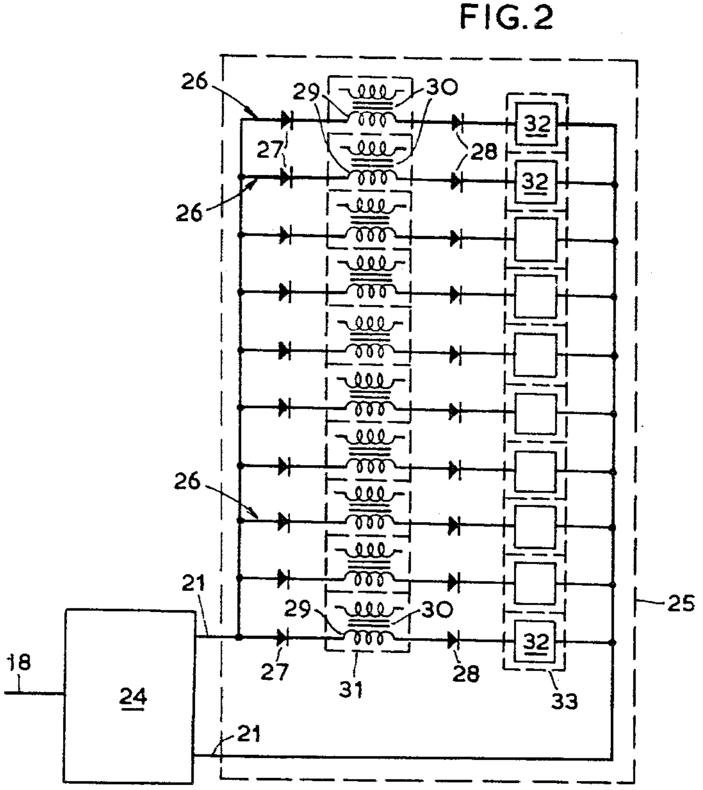

Referring now to FIG. 2 the circuit arrangement described with reference to FIG. 1 and comprising items 10 to 21 is represented in this figure by the rectangle 24, which is shown as having the input control circuit 18 and the output connections 21. The latter are connected to a load circuit which is generally indicated by the rectangle 25, and which includes a group of similar parallel-connected circuits 26. Each of these circuits 26 includes in series two blocking diodes 27 and 28 connected on either side of a secondary winding 29 of a transformer 30 which constitutes the output of one stage of a multi-stage adder 31, and a bi-stable device 32 constituting one element of a data storage device or register 33.

When the input circuit 18 is maintained at the aforesaid negative potential the production of a voltage pulse by any of the transformers 30 results in the production of a current pulse in the associated circuit 26 for setting the associated bi-stable device 32.

Since any number of the adder stages may produce an output voltage pulse at any given instant, the current pulse demand from the circuit 24 may have any value up to a maximum, as when all of the stages produce pulses simultaneously. The current pulse to be gated by the circuit 24 may thus in some instances, as for example when only one or a few of the adder stages produce output voltages simultaneously, be provided for wholly by the flow of current through the base circuit of the main transistor 20 and the effectively short-circuited auxiliary transistor 10. The maximum value of such a current pulse is determined by the saturation current gain of the auxiliary transistor 10.

When, however, a much greater current pulse is required, as for example when all or a substantial number of the adder stages function simultaneously, the main transistor 20 provides the major path for this current pulse.

When the magnitude of the required current pulse is such as to cause the main transistor 20 to conduct, the rate at which transistor 20 is rendered conducting is roughly proportional to the step of current that the auxiliary transistor 10 passes initially when in its short-circuited condition. Although the full current demand cannot be met instantaneously by the said circuit arrangement it can be met at least in part by the auxiliary transistor 10, and the rate of turning on the main transistor 20 can be made large so that only a small part of the input voltage pulse is lost.

Since the initial current demanded passes through the base circuit of the main transistor 20 and thereby effects the switching on action of this transistor only a very small demand current is required to gate or switch the required current pulse. It will therefore be appreciated that the circuit arrangement described with reference to FIG. 1 enables a very large current pulse to be gated in response to a relatively small input or controlling current, and that this circuit arrangement may be used to pass current pulses whose magnitudes may vary between a very small value and a substantially greater value without any loss of effectiveness.

The limiting value of the current pulse that is obtainable with this circuit arrangement is determined only by the limits imposed by the dissipation and maximum current ratings of the transistors, and the switching speed of this circuit is of the same order as a simple circuit in which the main transistor 20 is omitted and in which the output connections 21 are connected with the collector and emitter of the auxiliary transistor 10.

What I claim as my invention and desire to secure by Letters Patent is:

1. An electric transistor switching means for controlling in an On/Off manner the flow in a variable impedance load circuit of current pulses which result from E.M.F.'s induced in the load circuit, the switching means comprising a main transistor having its emitter-collector circuit connected between two terminals so as to form a switching circuit, the terminals enabling the switching circuit to be connected in such a load circuit, an auxiliary transistor having its emitter-collector circuit connected in series with emitter and collector load resistors to form an auxiliary circuit for connection between two different potential tappings of an electric supply source, means for electrically connecting together the collectors of the two transistors, means for connecting the base of the main transistor to the emitter of the auxiliary transistor, a potential divider connected in parallel with the said auxiliary circuit and having two tappings spaced thereon, one tapping thereon being connected to the base of the auxiliary transistor so that the base is normally held at a potential such as to render the auxiliary transistor fully conductive, an input connection connected to the second tapping of the potential divider for receiving a two-state input signal and including a diode for enabling current flow into the potential divider so as to adjust the base potential of the auxiliary transistor to a value at which the auxiliary transistor is held in a substantially non-conductive condition whenever the input signal applied to the input connection is of a first state, the said diode becoming reverse-biased whenever the input signal applied to the input connection is of a second state so as to allow the auxiliary transistor to be held in the fully conductive condition, means for connecting the emitter of the main transistor to a tapping of the supply source which has a potential intermediate those of the aforesaid tappings of the supply source, and diode means connected in the switching circuit adjacent one of the terminals for preventing the flow of current through the terminals to the load circuit from the said supply source, the emitter and the collector load resistors of the auxiliary transistor being so proportioned that when the auxiliary transistor is held in the conductive condition the collector-base junction of the auxiliary transistor is forward-biased, the auxiliary transistor is saturated, and the main transistor is almost but not quite saturated.

2. Electric apparatus comprising, in combination, a multi-stage binary adder including in each stage thereof an output pulse transformer having an output winding, a data storage register including a plurality of bi-stable storage devices, one for each stage of the adder and each storage device having a current responsive input circuit, circuit means for connecting together the output windings of the pulse transformers and the input circuits of the bi-stable storage devices in a parallel arrangement of branch load circuits each of which includes one such transformer output winding and the input circuit of a corresponding bi-stable storage device, diode means connected in the respective branch load circuits for preventing interaction between the various branch load circuits, an electric transistor switching means comprising a main transistor having its emitter-collector circuit connected between two terminals so as to form a switching circuit, connection means for connecting the said parallel arrangement of branch load circuits between the two terminals of the switching circuit, an auxiliary transistor having its emitter-collector circuit connected in series with emitter and collector load resistors to form an auxiliary circuit for connection between two different potential tappings of an electric supply source, means for electrically connecting together the collectors of the two transistors, means for connecting the base of the main transistor to the emitter of the auxiliary transistor, base control means responsive to a two-stage input signal for setting the base potential of the auxiliary transistor relative to the potentials of the supply source tappings at one or the other of two control potentials which cause the auxiliary transistor to be fully conductive or substantially non-conductive respectively in dependence upon the state of the input signal, means for connecting the emitter of the main transistor to a tapping of the supply source which has a potential intermediate those of the aforesaid tappings of the supply source, and diode means connected in the switching circuit adjacent one of the terminals for preventing the flow of current through the terminals to the load circuit from the said supply source, the emitter and collector load resistors of the auxiliary transistor being so proportioned that when the auxiliary transistor is held in the conductive condition the collector-base junction of the auxiliary transistor is forward-biased, the auxiliary transistor is saturated, and the main transistor is almost but not quite saturated so that current pulses may flow in the respective branch load circuits in response to voltage pulses induced therein by the respective output pulse transformers, such current pulses being prevented when the auxiliary transistor is in the substantially conductive condition.

3. An electric transistor switching means comprising a main transistor having its emitter-collector circuit connected between two terminals so as to form a switching circuit; a load circuit connected between the two terminals and comprising a voltage pulse generating means, a variable impedance load and connection means connecting the voltage pulse generating means and the variable impedance load in series with one another between the two terminals; an electric supply source having different potential tappings, an auxiliary transistor having its emitter-collector circuit connected in series with emitter and collector load resistors to form an auxiliary circuit for connection between two different potential tappings of said electric supply source, means for electrically connecting together the collectors of the two transistors, means for connecting the base of the main transistor to the emitter of the auxiliary transistor, the base of said auxiliary transistor being connected to the output of a base control means, said base control means being responsive to a two-state input signal for setting the base potential of the auxiliary transistor relative to the potentials of the electric supply source tappings at one or the other of two control potentials which cause the auxiliary transistor to be fully conductive or substantially non-conductive respectively in dependence upon one of the states of the input signal, means for connecting the emitter of the main transistor to a tapping of the supply source which has a potential intermediate those of the aforesaid tappings of the electric supply source, and diode means connected in circuit with one of the terminals and the load circuit for preventing the flow of current through the terminals to the load circuit from the said electric supply source, the emitter and the collector load resistors of the auxiliary transistor being of such impedance values that when the auxiliary transistor is held in the conductive condition the collector-base junction of the auxiliary transistor is forward-biased, the auxiliary transistor is saturated, and the main transistor is almost but not quite saturated so that current pulses may flow in the load circuit in response to voltage pulses induced therein by the voltage pulse generating means, such current pulses being prevented from such flow when the auxiliary transistor is in the substantially non-conductive condition.

References Cited by the Examiner

UNITED STATES PATENTS

| | | | |
|---|---|---|---|
| 2,988,688 | 6/1961 | Benton | 307—88.5 |
| 3,092,729 | 6/1963 | Cray | 307—88.5 |

ARTHUR GAUSS, *Primary Examiner.*